(12) United States Patent
Baik

(10) Patent No.: US 12,527,097 B2
(45) Date of Patent: Jan. 13, 2026

(54) PHOTODIODE AND IMAGE SENSOR INCLUDING THE SAME

(71) Applicant: SAMSUNG ELECTRONICS CO., LTD., Suwon-si (KR)

(72) Inventor: Chan-Wook Baik, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 431 days.

(21) Appl. No.: 18/106,605

(22) Filed: Feb. 7, 2023

(65) Prior Publication Data

US 2024/0055544 A1 Feb. 15, 2024

(30) Foreign Application Priority Data

Aug. 10, 2022 (KR) .................. 10-2022-0100154

(51) Int. Cl.
*H10F 30/227* (2025.01)
*H10F 77/40* (2025.01)

(52) U.S. Cl.
CPC ....... *H10F 30/2275* (2025.01); *H10F 77/413* (2025.01)

(58) Field of Classification Search
CPC .. H10F 30/2275; H10F 30/227; H10F 77/413; H10F 39/12; H10F 39/18; H10F 77/247
See application file for complete search history.

(56) References Cited

U.S. PATENT DOCUMENTS

| | | | |
|---|---|---|---|
| 6,486,503 B1 | 11/2002 | Fossum | |
| 6,531,725 B2 | 3/2003 | Lee et al. | |
| 7,190,041 B2 | 3/2007 | Rhodes et al. | |
| 10,770,504 B2 | 9/2020 | Na et al. | |
| 10,861,888 B2 | 12/2020 | Na et al. | |
| 2023/0128236 A1 | 4/2023 | Baik | |

FOREIGN PATENT DOCUMENTS

| | | | | |
|---|---|---|---|---|
| EP | 3719842 A1 | * | 10/2020 | ........... H10F 39/807 |
| KR | 20170140014 A | * | 12/2017 | ............. H01L 33/02 |
| KR | 10-2023-0057769 A | | 5/2023 | |

OTHER PUBLICATIONS

N. Teranishi, "The Pinned Photodiode", Front End Electronics Presentation, Jun. 2, 2016.*
TechSpot by Isaiah Mayersen, "Intel demos the 400G, a 400Gbps transceiver for the datacenter", Apr. 13, 2019, 7 pages, url: https://www.techspot.com/news/79640-intel-demos-400g-400gbpstransceiverdatacenter.html.
VentureBeat by Chris Angelini, "Intel sees bright future for silicon photonics, moving information at light speed in datacenters and beyond", May 24, 2021, 8 pages, url: https://venturebeat.com/business/intel-sees-bright-future-for-silicon-photonics-moving-information-at-light-speed-in-datacenters-and-beyond/.

(Continued)

*Primary Examiner* — Suberr L Chi
(74) *Attorney, Agent, or Firm* — Sughrue Mion, PLLC

(57) ABSTRACT

A photodiode according to an embodiment includes a semiconductor substrate, a Schottky junction structure layer disposed on the semiconductor substrate and including a first layer including a conductive material and a semiconductor layer, and a pinning layer disposed adjacent to the Schottky junction structure layer and fixing potentials of the semiconductor substrate and the first layer.

20 Claims, 28 Drawing Sheets

(56) References Cited

OTHER PUBLICATIONS

Jonathan Klamkin et al., "Indium Phosphide Photonic Integrated Circuits: Technology and Applications", 2018 IEEE BiCMOS and Compound Semiconductor Integrated Circuits and Technology Symposium (BCICTS), pp. 8-13, DOI: 10.1109/BCICTS.2018.8550947.
Molly Piels et al., "1—Photodetectors for silicon photonic integrated circuits", Photodetectors: Materials, Devices and Applications, 2016, pp. 3-20, DOI:10.1016/B978-1-78242-445-1.00001-4.
Eric R. Fossum et al., "A Review of the Pinned Photodiode for CCD and CMOS Image Sensors", IEEE Journal of the Electron Devices Society, vol. 2, No. 3, May 2014, pp. 33-43, DOI: 10.1109/JEDS.2014.2306412.
Alice Pelamatti, "Estimation and Modeling of Key Design Parameters of Pinned Photodiode CMOS Image Sensors for High Temporal Resolution Applications", Nov. 17, 2015, Institute Electronics Engineers (IEEE), 81 pages.

* cited by examiner

PHOTODIODE AND IMAGE SENSOR INCLUDING THE SAME

CROSS-REFERENCE TO RELATED APPLICATION

This application is based on and claims priority under 35 U.S.C. § 119 to Korean Patent Application No. 10-2022-0100154, filed on Aug. 10, 2022, in the Korean Intellectual Property Office, the disclosure of which is incorporated by reference herein in its entirety.

BACKGROUND

1. Field

The disclosure relates to a photodiode and an image sensor including the same.

2. Description of Related Art

A silicon-based P-N junction technology that is used mainly in a visible light band is widely used for a photodiode in related art, which is used in various types of complementary metal oxide semiconductor (CMOS) image sensors.

A photodiode by a P-N junction of silicon may not absorb photons having energy lower than bandgap energy of silicon (about 1.12 eV). Therefore, a silicon photodiode or a silicon CMOS image sensor, to which the silicon photodiode is applied, has high quantum efficiency mainly in the visible light band (about 400 nm to about 700 nm), and thus, is widely used in visible light cameras. However, because light is not well absorbed in silicon in a near-infrared band (about 700 nm to about 1600 nm), which is a longer wavelength than the visible light band, a material having a narrow bandgap, such as Ge or InGaAs, must be used. However, these materials are difficult to grow or synthesize, and in particular, they are difficult to form on a silicon substrate. Therefore, the development of these materials are limited to very expensive products or specific products.

SUMMARY

Devices consistent with the disclosure relate to a photodiode capable of absorbing light in a broad band and to an image sensor including the photodiode.

Additional aspects will be set forth in part in the description which follows and, in part, will be apparent from the description, or may be learned by practice of the example embodiments of the disclosure.

An example embodiment of a photodiode may include: a semiconductor substrate; a Schottky junction structure layer arranged on the semiconductor substrate, the Schottky junction structure layer and including a first layer including a conductive material and a semiconductor layer; and a pinning layer disposed adjacent to the Schottky junction structure layer, the pinning layer and fixing potentials of the semiconductor substrate and the first layer.

When the semiconductor layer is n-type, a work function of the first layer may satisfy the following condition:

$$\varphi_M > \chi_s$$

where $\varphi_M$ is a work function of the first layer, and $\chi_s$ is electron affinity of the semiconductor layer.

When the semiconductor layer is p-type, the work function of the first layer may satisfy the following condition:

$$\varphi_M < \chi_s + E_g$$

where $\varphi_M$ is a work function of the first layer, $\chi_s$ is electron affinity of the semiconductor layer, and $E_g$ is bandgap energy of the semiconductor layer.

The first layer may include a metal or a transparent conductive oxide (TCO) material.

The metal of the first layer may include Au, Al, Ag, Cu, Pt, Ni, W, Ti, Mo, Ru, Ge, Ta, Hf, Nb, Zr, or V.

The TCO material of the first layer may include at least one oxide semiconductor material, such as ITO, IWO, IZO, GZO, GIZO, or AZO.

The first layer may have a thickness greater than 0 nm and less than or equal to 100 nm.

The Schottky junction structure layer may further include a second layer including silicide in contact with the semiconductor layer.

A work function of the second layer may be set to have a Schottky-barrier height of the Schottky junction structure layer similar or lower than a Schottky barrier height of a structure in which a material of the first layer and a material of the semiconductor layer are combined.

The second layer may include a silicide material, such as TiSi, TiSi$_2$, Ti$_5$Si$_3$, VSi$_2$, FeSi$_2$, CoSi$_2$, PtSi, Pt$_2$Si, NiSi, NiSi$_2$, Ni$_2$Si, Cu$_3$Si, YSi, ZrSi, NbSi$_2$, MoSi$_2$, PdSi, Pd$_2$Si, ErSi, YbSi, YbSi$_2$, ZrSi$_2$, HfSi, HfSi$_2$, TaSi, TaSi$_2$, NbSi, NbSi$_2$, ZrSi, ZrSi$_2$, VSi, VSi$_2$, WSi, WSi$_2$, GeSi, OsSi, IrSi, IrSi$_3$, AlSi, CuSi, RuSi, or Ru$_2$Si$_3$.

The second layer may include a metallic material having a work function less than that of the first layer, such as Au, Al, Ag, Cu, Pt, Ni, W, Ti, Mo, Ru, Ge, Ta, Hf, Nb, Zr, or V.

The Schottky junction structure layer may further include an intermediate layer including an oxide or a nitride and disposed between the first layer and the second layer.

The intermediate layer may include an oxide, such as at least one of SiO$_2$, Al$_2$O$_3$, HfO$_2$, and TiO$_2$, or a nitride, such as at least one of TiN, AlN, and Si$_3$N$_4$.

A portion of one surface of the first layer facing the semiconductor layer may be in contact with the semiconductor layer, and another portion of the one surface of the first layer may be in contact with the pinning layer.

The one surface of the first layer facing the semiconductor layer may be entirely in contact with the pinning layer.

The Schottky junction structure layer may further include a distributed Bragg reflective layer (DBR layer) on the first layer.

The photodiode may be configured to sense light in visible and infrared bands.

According to another aspect of the disclosure, an image sensor includes a photodiode including a semiconductor substrate, a Schottky junction structure layer arranged on the semiconductor substrate, and the Schottky junction structure layer including a first layer including a conductive material and a semiconductor layer, and a pinning layer disposed adjacent to the Schottky junction structure layer, the pinning layer fixing potentials of the semiconductor substrate and the first layer, and at least one transistor for controlling an electrical signal generated by the photodiode.

A sense node apart from the Schottky junction structure layer may further be formed on the semiconductor substrate, wherein the at least one transistor may include a reset transistor for resetting a potential of the sense node, a drive transistor for amplifying a change in an electrical potential of the sense node and transferring a result of amplification to a selection transistor, and a selection transistor that selects unit pixels to be read in units of rows.

A floating diffusion node may be located apart from the Schottky junction structure layer, wherein the at least one transistor may include a transfer transistor connected between the photodiode and the floating diffusion node, a reset transistor for resetting a potential of the floating diffusion node, a drive transistor for amplifying a change in an electrical potential of the floating diffusion and transferring a result of amplification to a selection transistor, and a selection transistor for selecting unit pixels to be read in units of rows.

BRIEF DESCRIPTION OF THE DRAWINGS

The above and other aspects, features, and advantages of example embodiments of the disclosure will be more apparent from the following description taken in conjunction with the accompanying drawings, in which.

DETAILED DESCRIPTION

Figure 1:
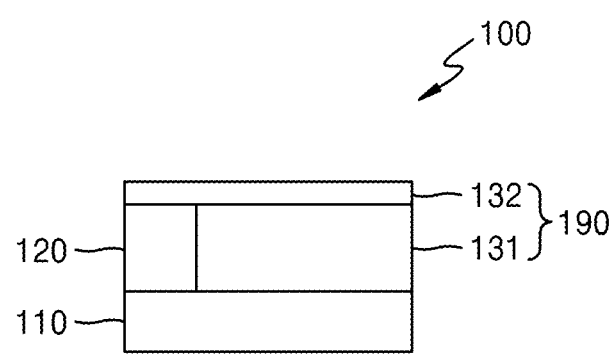
FIG. 1 is a cross-sectional view of a photodiode according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. The embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a photodiode and an image sensor including the same are described in detail with reference to the accompanying drawings. In the drawings, the size of each component may be exaggerated for clarity and convenience of description. Example embodiments may have various modifications and may be embodied in many different forms.

Hereinafter, when an element or layer is referred to as being "on" or "above" another element or layer, the element or layer may be directly on another element or layer or intervening elements or layers. The singular forms are intended to include the plural forms as well, unless the context clearly indicates otherwise. When a part "comprises" or "includes" an element in the specification, unless otherwise defined, other elements are not excluded from the part and the part may further include other elements.

In the specification, the term "above" and similar directional terms may be applied to both singular and plural. With respect to operations that constitute a method, the operations may be performed in any appropriate sequence unless the sequence of operations is clearly described or unless the context clearly indicates otherwise, and the operations may not necessarily be performed in the order of sequence.

Connections or connection members of lines between components shown in the drawings illustrate functional connections and/or physical or circuit connections, and the connections or connection members may be represented by replaceable or additional various functional connections, physical connections, or circuit connections in an actual apparatus.

All examples or example terms are simply used to explain in detail the technical scope of the inventive concept, and thus, the scope of the inventive concept is not limited by the examples or the example terms as long as it is not defined by the claims.

FIG. 1 is a cross-sectional view of a photodiode 100 according to an embodiment.

Referring to FIG. 1, the photodiode 100 includes a semiconductor substrate 110, a Schottky junction structure layer 190 on the semiconductor substrate 110, and a pinning layer 120 disposed adjacent to the Schottky junction structure layer 190. The Schottky junction structure layer 190 may include a first layer 132 including a conductive material and a semiconductor layer 131. The pinning layer 120 may fix potentials of the semiconductor substrate 110 and the first layer 132.

The semiconductor substrate 110 may include a silicon semiconductor. The semiconductor substrate 110 may include a p-type silicon semiconductor.

The pinning layer 120 may include a semiconductor material doped with a p-type dopant or an n-type dopant. The pinning layer 120 may remove current noise flowing at an interface between the semiconductor layer 131 and the first layer 132 and may fix potentials so that the semiconductor substrate 110 and the first layer 132 have the same potential.

The semiconductor layer 131 may include an n-type well (n-well) layer. The semiconductor layer 131 may be disposed on the semiconductor substrate 110 and form a P-N junction structure with the semiconductor substrate 110.

The first layer 132 may be disposed on the semiconductor layer 131 and form a Schottky junction structure with the semiconductor layer 131.

The first layer 132 may include a metal. The first layer 132 may include, for example, Au, Al, Ag, Cu, Pt, Ni, W, Ti, Mo, Ru, Ge, Ta, Hf, Nb, Zr, or V. The first layer 132 may include a transparent conductive oxide (TCO) having a property of being transparent to light in an infrared to visible light band. The first layer 132 may include, for example, an oxide semiconductor material, such as ITO, IWO, IZO, GZO, GIZO, or AZO. The first layer 132 may have a thickness greater than 0 and less than or equal to about 100 nm.

As shown in FIG. 1, among both surfaces of the first layer 132, a portion of one surface facing the semiconductor layer 131 is in contact with the semiconductor layer 131, and the other portion of the first surface is in contact with the pinning layer 120. However, this is only an example, and in another embodiment, the entire surface of the first layer 132 facing the semiconductor layer 131 may contact the pinning layer 120.

Figure 2:
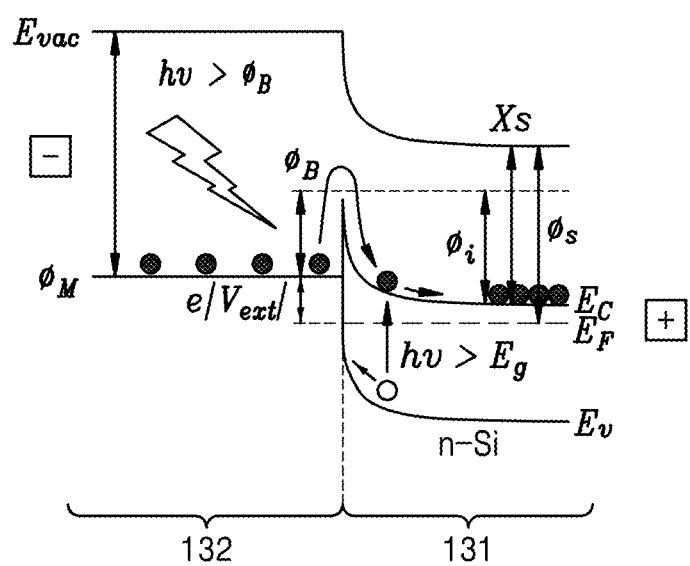
FIG. 2 is an energy band diagram of the photodiode of FIG. 1 for a state in which a reverse bias voltage is applied to the photodiode.

FIG. 2 is an energy band diagram of the photodiode 100 of FIG. 1 for a state in which a reverse bias voltage is applied to the photodiode 100.

When the semiconductor layer 131 is n-type, a work function of the first layer 132 may satisfy the following requirements.

$$\varphi_M > \chi_s \quad (1)$$

Here, $\varphi_M$ is a work function of the first layer 132, and $\chi_s$ is electron affinity of the semiconductor layer 131.

Referring to FIG. 2, the work function $\varphi_M$ of the first layer 132 is shown according to the requirements of Equation (1). In this case, the Schottky barrier height (energy) $\varphi_B$ may be expressed by the following equation, where $E_c$ is conduction band and $E_F$ is the Fermi level.

$$\varphi_B = (\varphi_M - \varphi_s) + (E_c - E_F) = \varphi_M - \chi_s \quad (2)$$

For example, when the first layer 132 is PtSi and the semiconductor layer 131 is n-type silicon, $\varphi_B$ is 4.9−4.05=0.85 eV according to Equation (2). In this case, light having an energy of 1.12 eV or more, which is the band gap energy of silicon, is absorbed at a P-N junction of the semiconductor substrate 110 and the semiconductor layer 131, and form carriers. The carriers are move to the semiconductor layer 131 by an externally applied reverse bias voltage to generate a photocurrent. On the other hand, light having energy higher than the Schottky barrier height ($\varphi_B$=0.85 eV) of the semiconductor layer 131 and the first layer 132 and lower than the band gap energy of a silicon semiconductor layer, that is, 1.12 eV is absorbed in the first layer 132, and at this time, because electrons among carriers generated by internal photoemission effect (IPE) have higher energy than the Schottky barrier, the electrons move to the semiconductor layer 131 over the Schottky barrier and generate a photocurrent.

Figure 3:
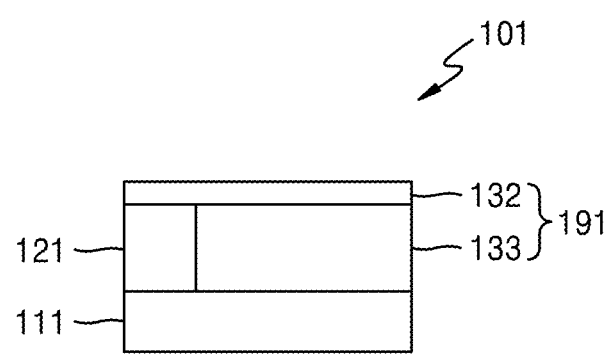
FIG. 3 is a cross-sectional view of a photodiode according to an embodiment.

FIG. 3 is a cross-sectional view of a photodiode 101 according to an embodiment.

Referring to FIG. 3, the photodiode 101 may include a semiconductor substrate 111, a Schottky junction structure layer 191 disposed on the semiconductor substrate 111 and including a first layer 132 and a semiconductor layer 133, and a pinning layer 121 disposed adjacent to the Schottky junction structure layer 191 and fixing potentials of the semiconductor substrate 111 and the first layer 132.

The semiconductor substrate 111 may include a silicon semiconductor. The semiconductor substrate 111 may include an n-type silicon semiconductor.

The semiconductor layer 133 may be include a p-type well (p-well) layer. The semiconductor layer 133 may be disposed on the semiconductor substrate 111 and form a P-N junction structure with the semiconductor substrate 111.

Figure 4:
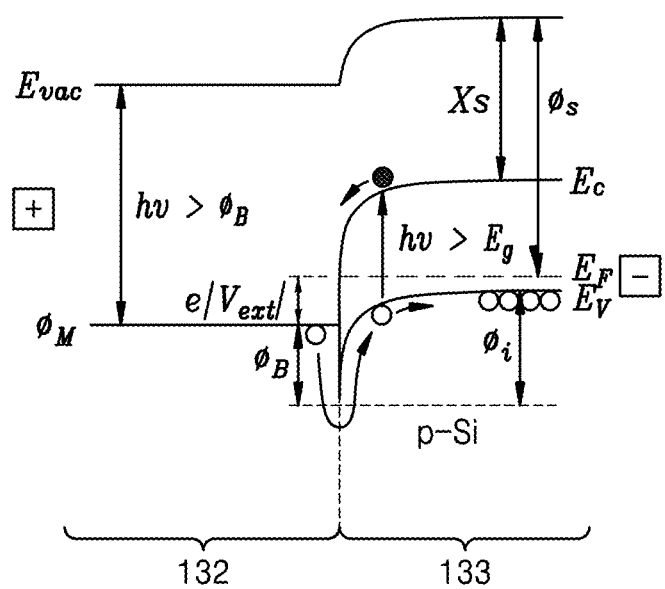
FIG. 4 is an energy band diagram of the photodiode of FIG. 3 for a state in which a reverse bias voltage is applied to the photodiode.

FIG. 4 is an energy band diagram of the photodiode 101 of FIG. 3 for a state in which a reverse bias voltage is applied to the photodiode 101.

When the semiconductor layer 133 is p-type, a work function of the first layer 132 may satisfy the following requirements.

$$\varphi_M < \chi_s + E_g \quad (3)$$

Here, $\varphi_M$ is a work function of the first layer 132, $\chi_s$ is electron affinity of the semiconductor layer 133, and $E_g$ is bandgap energy of the semiconductor layer 133.

Referring to FIG. 4, the work function $\varphi_M$ of the first layer 132 is shown according to the requirements of Equation (3). In this case, the Schottky barrier height (energy) $\varphi_B$ may be expressed by the following equation.

$$\varphi_B = E_g - (\varphi_M - \chi_s) \quad (4)$$

For example, when the first layer 132 is PtSi and the semiconductor layer 133 is p-type silicon, $\varphi_B$ is 1.12−(4.9−4.05)=0.27 eV according to Equation (4).

When a photodiode has a Schottky junction by combining the semiconductor layers 131 and 133 with the first layer 132, if there is incident light energy that crosses over the Schottky barrier due to IPE caused by light absorption inside the first layer 132, it is possible to generate a photocurrent. Accordingly, it is possible to sense light of a wide wavelength band including light having a longer wavelength than visible light.

The photodiode may sense light by two mechanisms: internal photoemission effect (IPE) and photovoltaic (PV). That is, when the energy hu of incident light is greater than the Schottky barrier height $\varphi_B$ and less than the bandgap energy $E_g$ of the semiconductor layers 131 and 133, that is, when $E_g$>hu>$\varphi_B$, the incident light is sensed by a IPE mechanism, and when the energy hu of the incident light is greater than the bandgap energy $E_g$ of the semiconductor layer 133, that is, when hu>$E_g$, the incident light is sensed by a PV action.

The photodiode may reduce a Schottky barrier and may generate a photocurrent by two actions, that is, an IPE action and a PV action. Thus, light of a wide wavelength band, for example, a wavelength band including both visible and infrared bands, may be efficiently sensed. The photodiode may sense, for example, light in a wavelength band in a range from about 400 nm to about 1700 nm.

Figure 5:
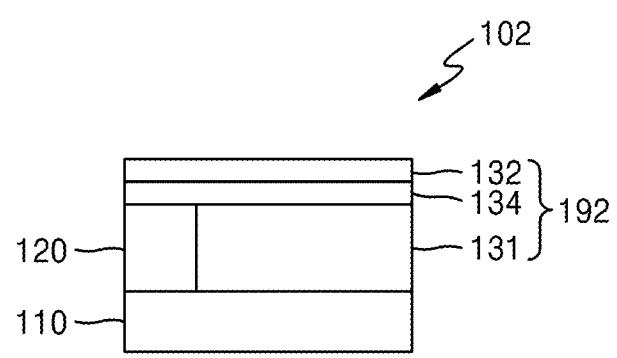
FIG. 5 is a cross-sectional view of a photodiode according to an embodiment.

FIG. 5 is a cross-sectional view of a photodiode 102 according to an embodiment.

Referring to FIG. 5, the photodiode 102 may include a semiconductor substrate 110, a Schottky junction structure layer 192 disposed on the semiconductor substrate 110 and including a first layer 132, a semiconductor layer 131, and an intermediate layer 134 disposed between the first layer 132 and the semiconductor layer 131, and a pinning layer 120 disposed adjacent to the Schottky junction structure layer 192 and fixing potentials of the semiconductor substrate 110 and the first layer 132.

The semiconductor substrate 110, the pinning layer 120, the semiconductor layer 131, and the first layer 132 may be the same as the semiconductor substrate 110, the pinning layer 120, the semiconductor layer 131, and the first layer 132 of FIG. 1, respectively.

The intermediate layer 134 may contact the semiconductor layer 131. The intermediate layer 134 may include a plurality of layers, and the detailed structures thereof are described with reference to FIGS. 18 and 19.

Figure 6:
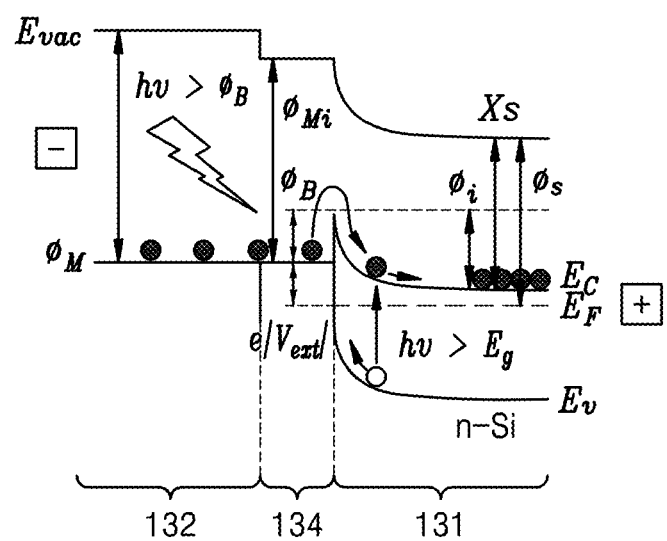
FIG. 6 is an energy band diagram of the photodiode of FIG. 5 for a state in which a reverse bias voltage is applied to the photodiode.

FIG. 6 is an energy band diagram of the photodiode 102 of FIG. 5 for a state in which a reverse bias voltage is applied to the photodiode 102.

When the semiconductor layer 131 is n-type, a work function of the intermediate layer 134 may satisfy the following requirements.

$$\varphi_M > \varphi_{Mi} > \chi_s \tag{5}$$

Here, $\varphi_M$ is a work function of the first layer 132, $\varphi_{Mi}$ is a work function of the intermediate layer 134, and $\chi_s$ is electron affinity of the semiconductor layer 131.

Referring to FIG. 6, the work function $\varphi_{Mi}$ of the intermediate layer 134 is shown according to the requirements of Equation (5). In this case, the Schottky barrier height (energy) $\varphi_B$ may be expressed by the following equation, where $E_c$ is conduction band and $E_F$ is the Fermi level.

$$\varphi_B = (\varphi_{Mi} - \varphi_s) + (E_c - E_F) = \varphi_{Mi} - \chi_s \tag{6}$$

For example, when the first layer 132 includes ITO, the intermediate layer 134 includes TiN, and the semiconductor layer 131 includes n-type silicon, $\varphi_B$ is 4.5−4.05=0.45 eV according to Equation (6). In this case, light having an energy of 1.12 eV or more, which is the bandgap energy of silicon, is absorbed at a P-N junction between the semiconductor substrate 110 and the semiconductor layer 131, and light having an energy of 0.45 eV or more and 1.12 eV or less is absorbed in the first layer 132, and because electrons among carriers generated by the IPE have higher energy than the Schottky barrier, the electrons cross over the Schottky barrier, move to the semiconductor layer 131, and generate a photocurrent.

On the other hand, when the Schottky barrier is formed by combining ITO and n-type silicon, a Schottky barrier height is calculated as $\phi_M - \chi_s$ according to Equation (2), and is 4.7−4.05=0.65 eV.

That is, the Schottky barrier height (0.45 eV) in the embodiment including the intermediate layer 134 is lower than the Schottky barrier height (0.65 eV) when only the first layer 132 and the semiconductor layer 131 are combined. When the Schottky barrier height is reduced, light energy that may be sensed by the photodiode is reduced, and thus, light having a longer wavelength may be sensed.

Figure 7:
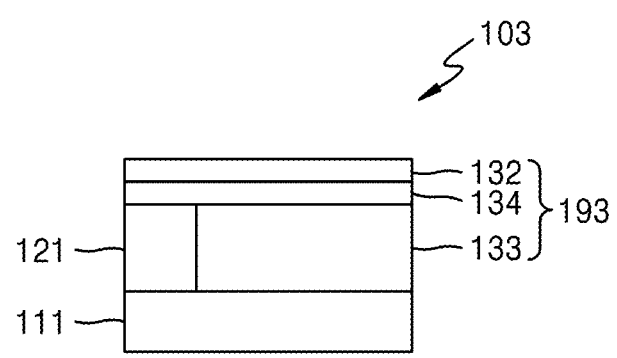
FIG. 7 is a cross-sectional view of a photodiode according to an embodiment.

FIG. 7 is a cross-sectional view of a photodiode 103 according to an embodiment.

Referring to FIG. 7, the photodiode 103 may include a semiconductor substrate 111, a Schottky junction structure layer 193 disposed on the semiconductor substrate 111 and including a first layer 132, a semiconductor layer 133, and an intermediate layer 134 disposed between the first layer 132 and the semiconductor layer 133 and a pinning layer 121 disposed adjacent to the Schottky junction structure layer 193 and fixing potentials of the semiconductor substrate 111 and the first layer 132.

The semiconductor substrate 111, the pinning layer 121, the semiconductor layer 133, and the first layer 132 may be the same as the semiconductor substrate 111, the pinning layer 121, the semiconductor layer 133, and the first layer 132 of FIG. 3 and the intermediate layer 134 may be the same as the intermediate layer 134 of FIG. 5.

Figure 8:
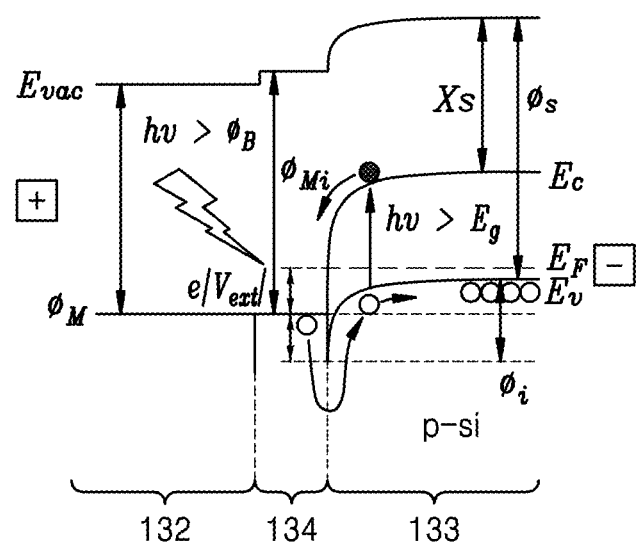
FIG. 8 is an energy band diagram of the photodiode of FIG. 7 for a state in which a reverse bias voltage is applied to the photodiode.

FIG. 8 is an energy band diagram of the photodiode 103 of FIG. 7 for a state in which a reverse bias voltage is applied to the photodiode 103.

When the semiconductor layer 133 is p-type, the work function of the intermediate layer 134 may satisfy the following requirements.

$$\varphi_M < \varphi_{Mi} < \chi_s + E_g \tag{7}$$

Here, $\varphi_M$ is a work function of the first layer 132, $\varphi_{Mi}$ is a work function of the intermediate layer 134, $\chi_s$ is electron affinity of the semiconductor layer 133, and $E_g$ is bandgap energy of the semiconductor layer 133.

When the first layer 132 includes ITO and the semiconductor layer 133 includes a p-type silicon well layer, the intermediate layer 134 may include, for example, Cu or Ni.

Referring to FIG. 8, the work function $\varphi_{Mi}$ of the intermediate layer 134 is shown according to the requirements of Equation (7). In this case, a Schottky barrier height (energy) $\varphi_B$ may be expressed by the following equation.

$$\phi_B = E_g - (\phi_{Mi} - \chi_s) \tag{8}$$

For example, when the first layer 132 includes ITO, the intermediate layer 134 includes Cu(111), and the semiconductor layer 133 includes a p-type silicon layer, $\varphi_B$ is 1.12−(4.98−4.05)=0.19 eV according to Equation (8).

For example, when the first layer 132 includes ITO, the intermediate layer 134 includes Ni(110), and the semiconductor layer 133 includes p-type silicon, $\varphi_B$ is 1.12−(5.04−4.05)=0.13 eV.

On the other hand, when the Schottky barrier is formed by combining ITO and p-type silicon, the Schottky barrier height is calculated as $\phi_B = E_g - (\phi_M - \chi_s)$ according to Equation (4), and is 1.12−(4.7−4.05)=0.47 eV.

In this way, even in the case of a photodiode according to the embodiment in which the semiconductor layer 133 is p-type, when the intermediate layer 134 is included between the first layer 132 and the semiconductor layer 133, the Schottky barrier height (0.13 eV) appears lower than the Schottky barrier height (0.47 eV) when the first layer 132 and the semiconductor layer 133 are combined. When the Schottky barrier height is reduced, light energy that may be sensed by the photodiode is reduced, and thus, light having a longer wavelength may be sensed.

Figure 9A:
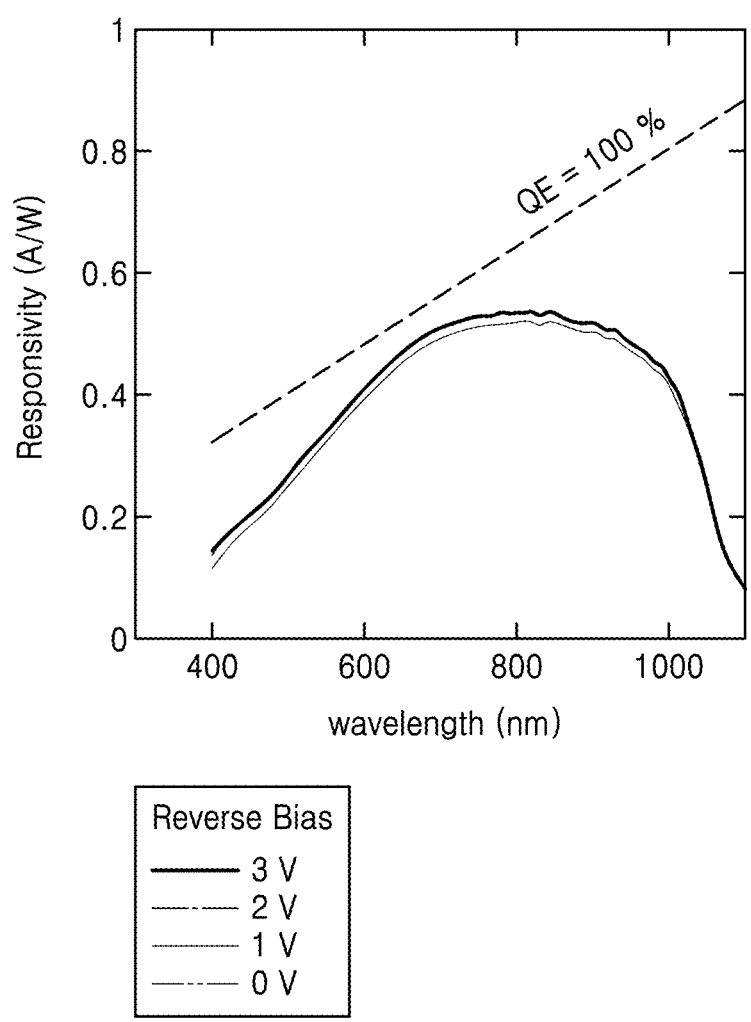
FIG. 9A is a graph showing responsivity of a photodiode according to a wavelength of incident light, according to an embodiment.

FIG. 9A is a graph showing the responsivity of a photodiode according to an embodiment according to a wavelength of incident light.

FIG. 9A is for a photodiode having an ITO-TiN-pSi structure and a pixel size of 3.6*3.6 mm, and is a graph showing a measurement result of responsivity according to an applied voltage according to a wavelength of incident light. Referring to FIG. 9A, it may be seen that the photodiode shows high responsivity not only in the visible light band but also in the infrared band (700 nm or more).

Figure 9B:
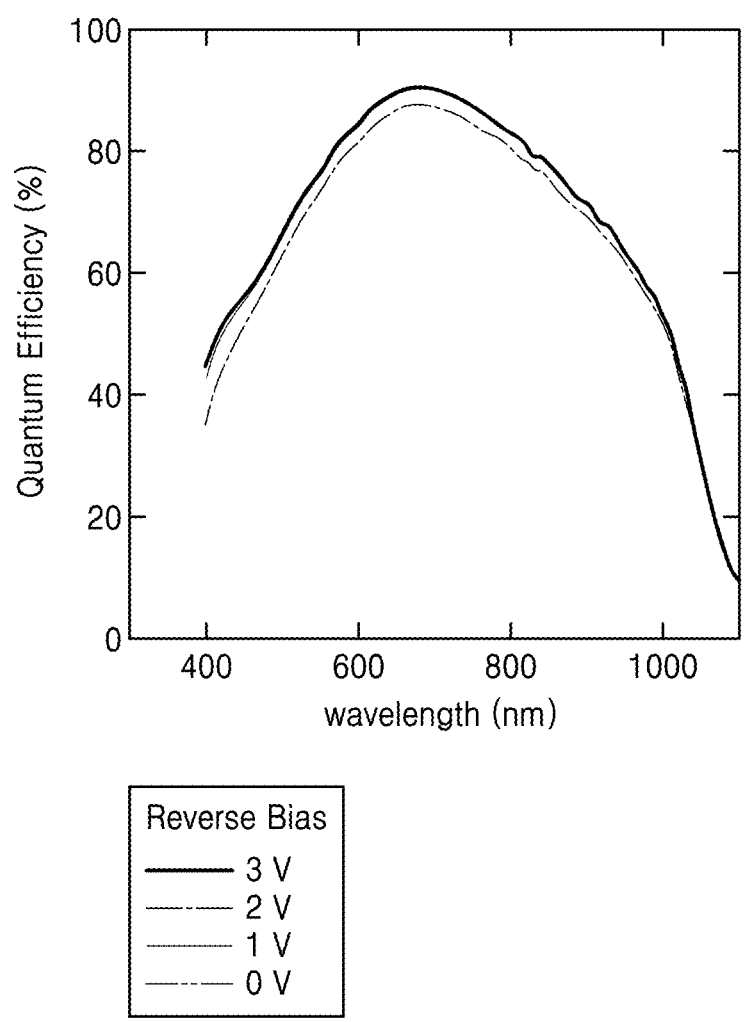
FIG. 9B is a graph illustrating quantum efficiency of a photodiode according to a wavelength of incident light, according to an embodiment.

FIG. 9B is a graph illustrating quantum efficiency of a photodiode according to an embodiment according to a wavelength of incident light.

FIG. 9B is for a photodiode having an ITO-TiN-pSi structure and a pixel size of 3.6*3.6 mm, and is a graph showing a measurement result of quantum efficiency according to an applied voltage according to a wavelength of incident light. Referring to FIG. 9B, it may be seen that the photodiode shows high quantum efficiency not only in the visible light band but also in the infrared band (700 nm or more).

Figure 10A:
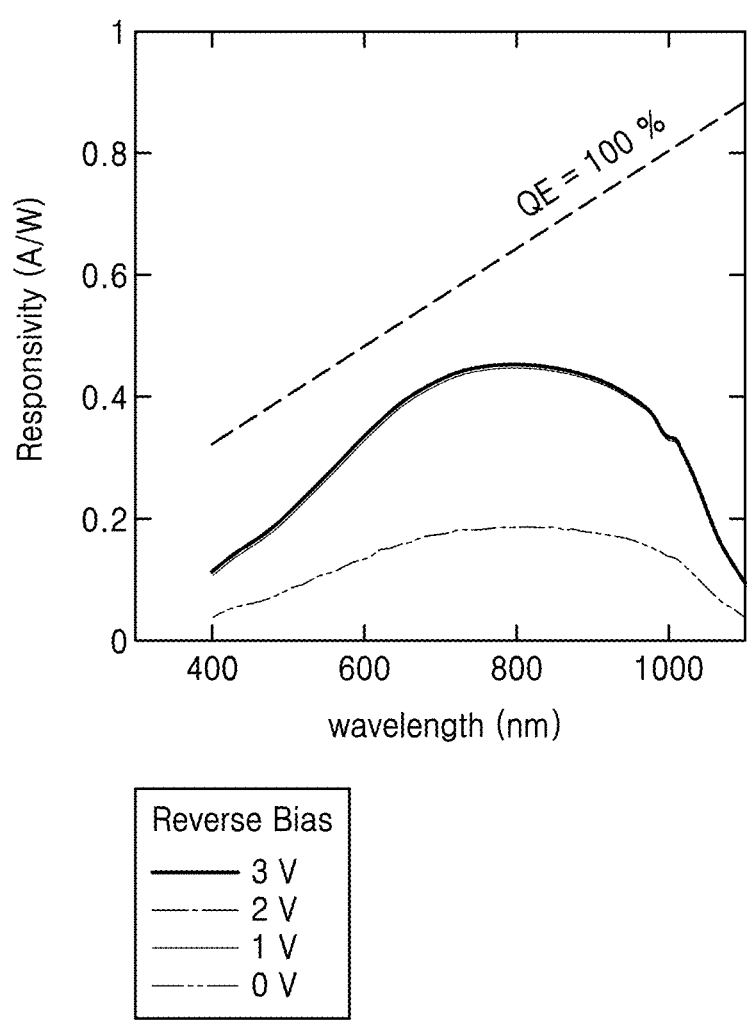
FIG. 10A is a graph showing responsivity of a photodiode according to a wavelength of incident light, according to an embodiment.

FIG. 10A is a graph showing the responsivity of a photodiode according to an embodiment according to a wavelength of incident light.

FIG. 10A is for a photodiode having an ITO-TiN—NiSi-pSi structure and a pixel size of 3.6*3.6 mm, and is a graph showing a measurement result of responsivity according to an applied voltage according to a wavelength of incident light. Referring to FIG. 10A, it may be seen that the photodiode shows high responsivity not only in the visible light band but also in the infrared band (700 nm or more).

Figure 10B:
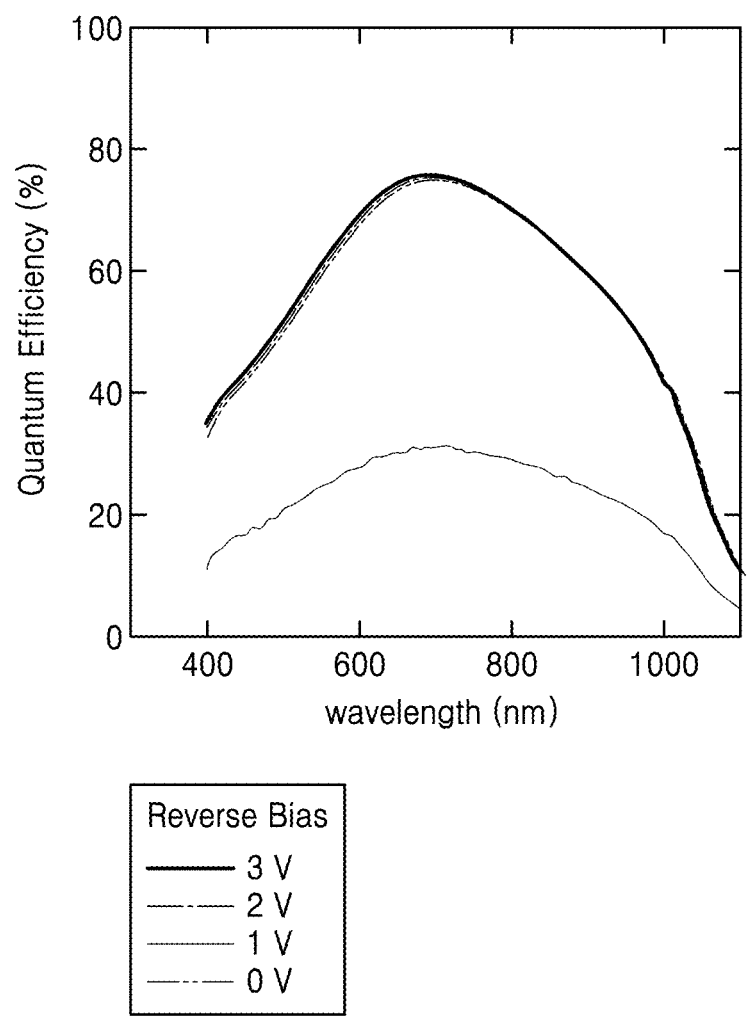
FIG. 10B is a graph illustrating quantum efficiency of a photodiode according to a wavelength of incident light, according to an embodiment.

FIG. 10B is a graph illustrating quantum efficiency of a photodiode according to an embodiment according to a wavelength of incident light.

FIG. 10B is for a photodiode having an ITO-TiN—NiSi-pSi structure and a pixel size of 3.6*3.6 mm, and is a graph showing a measurement result of quantum efficiency according to an applied voltage according to a wavelength of incident light. Referring to FIG. 10B, it may be seen that the photodiode shows high quantum efficiency not only in the visible light band but also in the infrared band (700 nm or more).

Figure 10C:
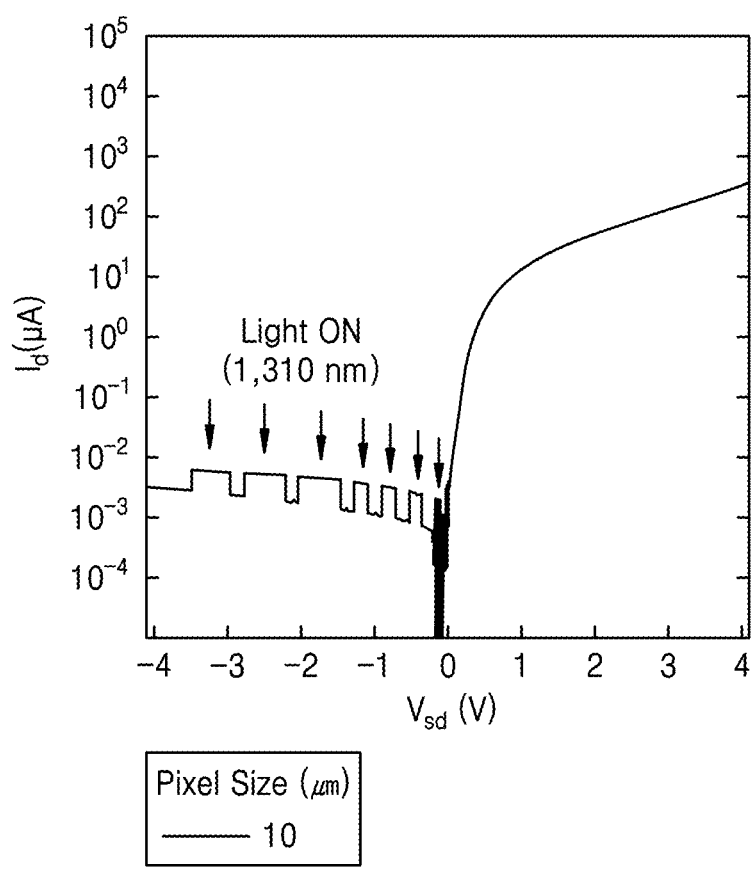
FIGS. 10C and 10D are graphs showing a photoelectric signal measurement result of a photodiode according to an embodiment.
Figure 10D:
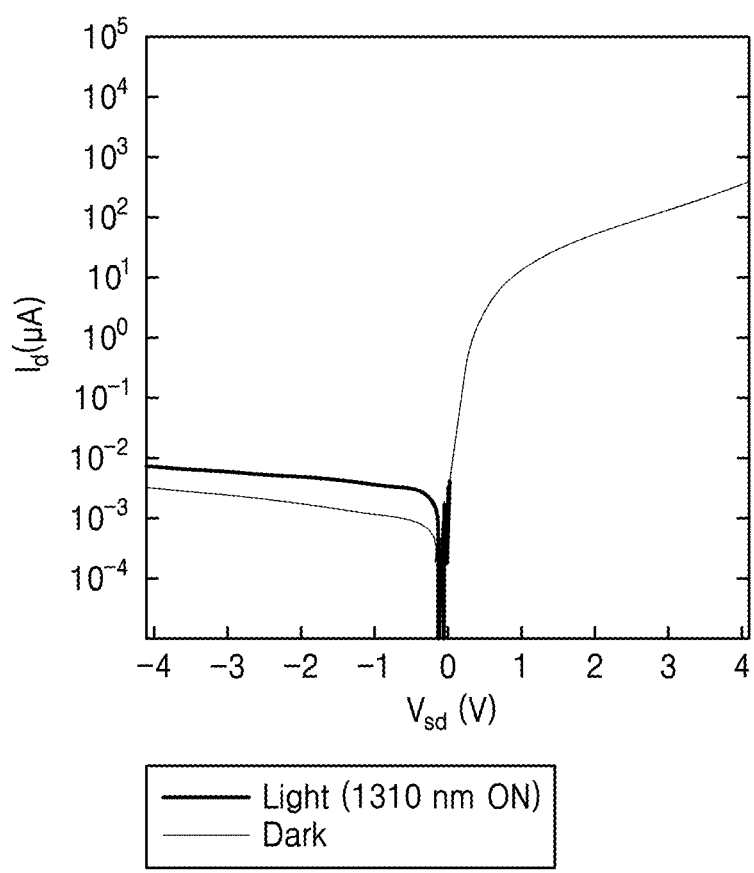

FIGS. 10C and 10D are graphs showing a photoelectric signal measurement result of a photodiode according to an embodiment.

FIGS. 1Cc and 10D are for a photodiode having an ITO-TiN—NiSi-pSi structure and a pixel size of 10*10 μm, and are graphs showing measurement results of a current signal by light having a wavelength of 1,310 nm.

Referring to FIG. 10C, when light having a wavelength of 1,310 nm is passed through the photodiode, a change in the current signal appears. Through the photodiode responds to light with a wavelength of 1310 nm, it may be seen that light in the infrared band may be sensed.

Referring to FIG. 10D, when light having a wavelength of 1,310 nm is incident, it was measured that a photocurrent higher than a dark current is generated. Through this fact, it may be confirmed that the photodiode may sense light in an infrared band.

Figure 11A:
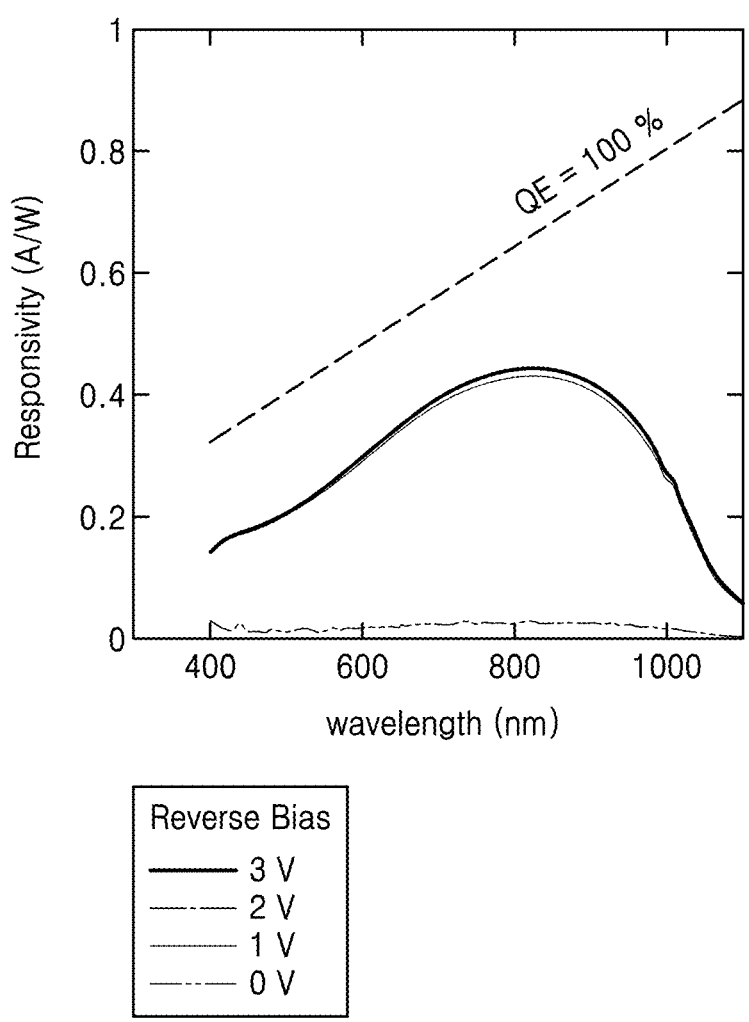
FIG. 11A is a graph illustrating responsivity of a photodiode according to a wavelength of incident light, according to an embodiment.

FIG. 11A is a graph illustrating a responsivity of a photodiode according to an embodiment according to a wavelength of incident light.

FIG. 11A is for a photodiode having an ITO-TiN—NiSi-nSi structure and a pixel size of 3.6*3.6 mm, and is a graph showing a result of measuring the responsivity according to an applied voltage according to a wavelength of incident light. Referring to FIG. 11A, it may be seen that the photodiode shows high responsivity not only in the visible light band but also in the infrared band (700 nm or more).

Figure 11B:
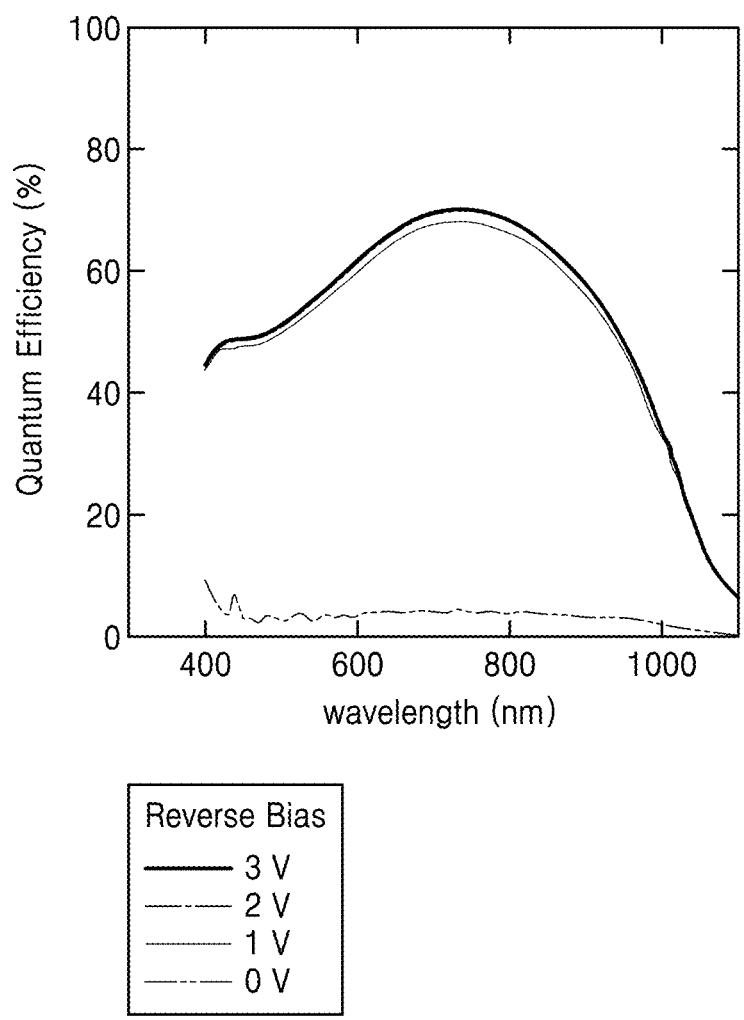
FIG. 11B is a graph illustrating quantum efficiency of a photodiode according to a wavelength of incident light, according to an embodiment.

FIG. 11B is a graph illustrating quantum efficiency of a photodiode according to a wavelength of incident light, according to an embodiment.

FIG. 11B is for a photodiode having an ITO-TiN—NiSi-nSi structure and a pixel size of 3.6*3.6 mm, and is a graph showing a result of measuring quantum efficiency according to an applied voltage according to a wavelength of incident light. Referring to FIG. 11B, it may be seen that the photodiode shows high quantum efficiency not only in the visible light band but also in the infrared band (700 nm or more).

Figure 11C:
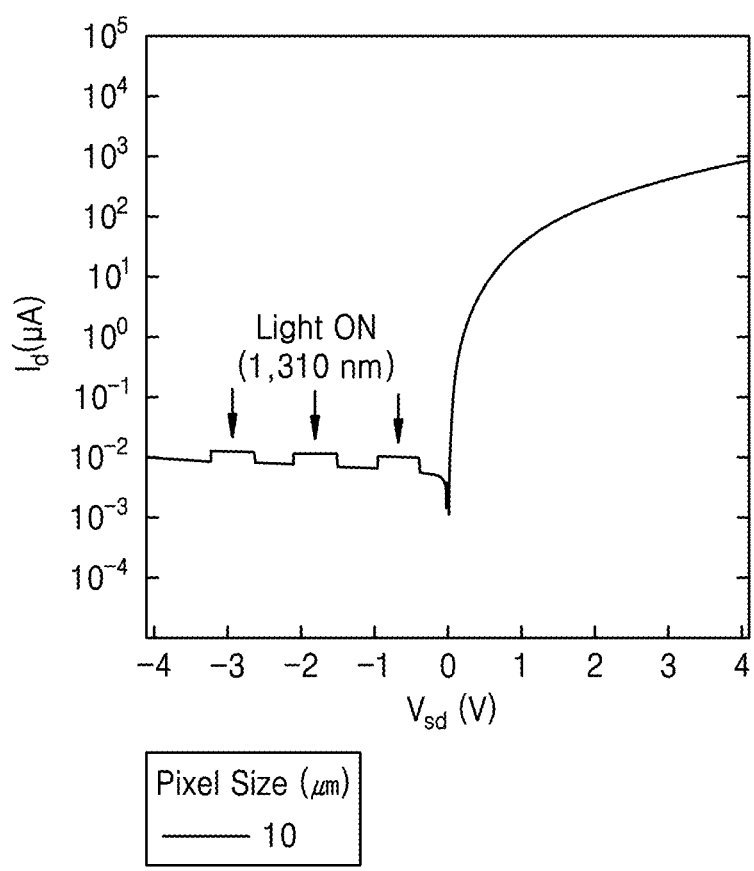
FIGS. 11C and 11D are graphs showing a photoelectric signal measurement result of a photodiode according to an embodiment.
Figure 11D:
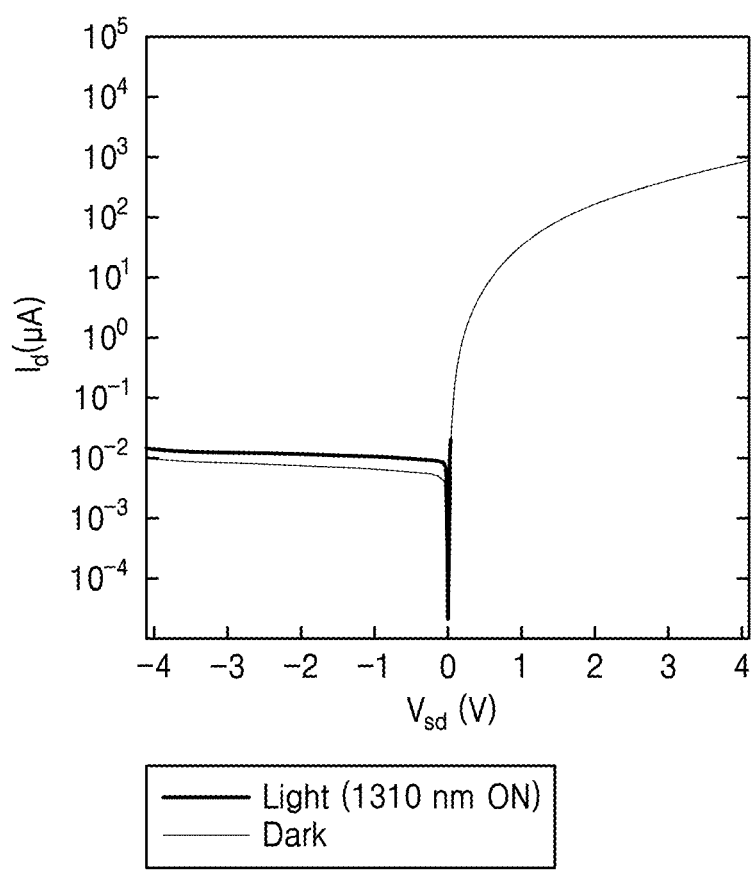

FIGS. 11C and 11D are graphs showing a photoelectric signal measurement result of a photodiode according to an embodiment.

FIGS. 11C and 11D are for a photodiode having an ITO-TiN—NiSi-nSi structure and a pixel size of 10*10 μm, and are graphs showing measurement results of a current signal by light having a wavelength of 1,310 nm.

Referring to FIG. 11C, when light having a wavelength of 1,310 nm is passed through the photodiode, a change in the current signal appears. It may be seen that the photodiode responds to light of a wavelength of 1,310 nm, and thus, light in an infrared band may be sensed.

Referring to FIG. 11D, when light having a wavelength of 1,310 nm is incident on the photodiode, it was measured that a photocurrent higher than a dark current is generated. Through this fact, it may be confirmed that the photodiode may sense light in the infrared band.

FIGS. 12 to 17 are cross-sectional views of photodiodes 200, 201, and 202 according to various embodiments.

Figure 12:
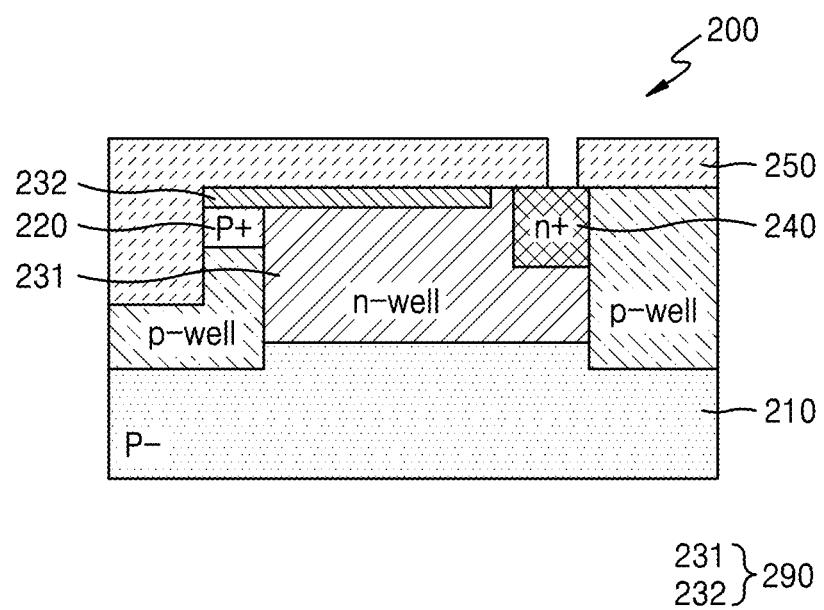
FIGS. 12 to 17 are cross-sectional views of photodiodes according to various embodiments.
Figure 13:
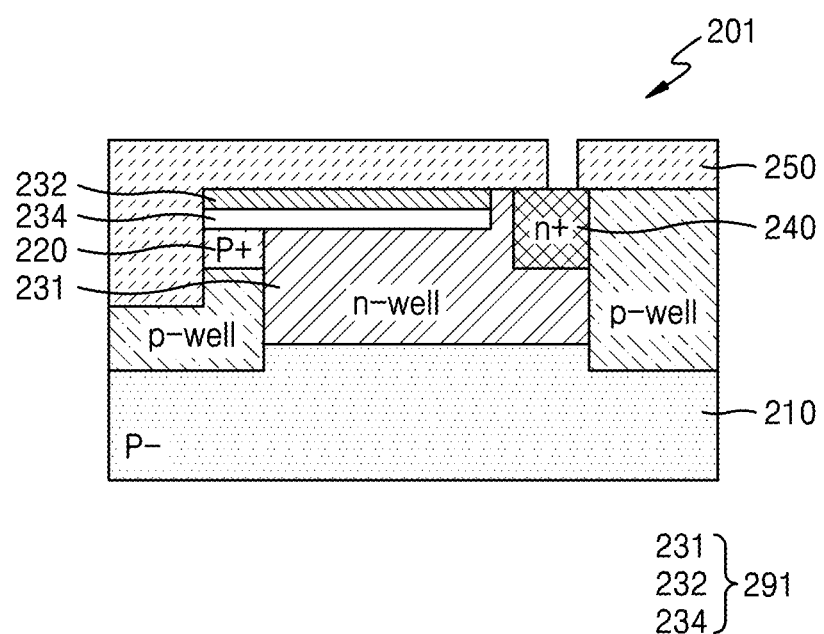
Figure 14:
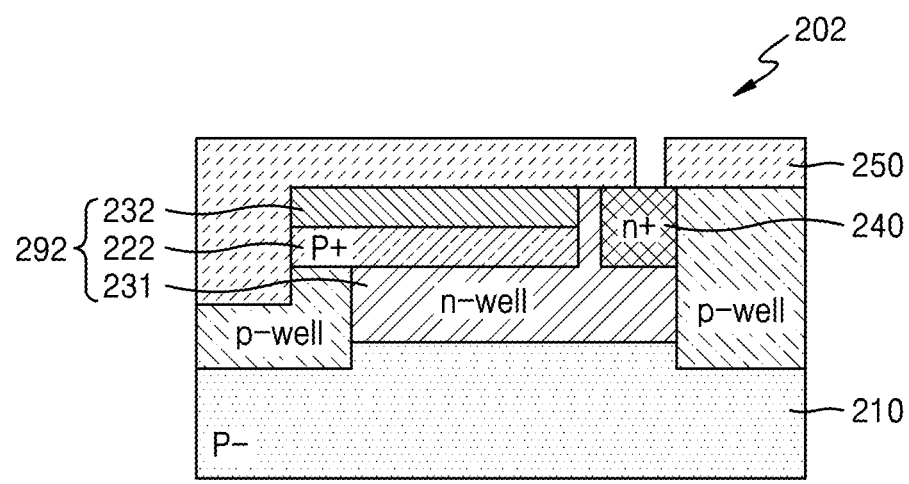

The photodiodes 200, 201, and 202 of FIGS. 12 to 14 may have, for example, a structure suitable for being applied to an image sensor having a 3-transistor (3T) circuit structure.

Referring to FIG. 12, the photodiode 200 may include a Schottky junction structure layer 290 and a pinning layer 220 formed on a p-type semiconductor substrate 210. The Schottky junction structure layer 290 includes an n-type well layer 231 formed in a partial region of the p-type semiconductor substrate 210 and a first layer 232 formed on the n-type well layer 231. A Schottky barrier junction structure is formed at an interface between the n-type well layer 231 and the first layer 232. A portion of the n-type well layer 231 may be heavily doped with an n-type dopant to form an n+ doped layer 240. The semiconductor substrate 210, the pinning layer 220, and the first layer 232 may be the same as the semiconductor substrate 110, the pinning layer 120, and the first layer 132 of FIG. 1. An insulating layer 250 may be provided on an uppermost surface of the photodiode 200. The insulating layer 250 may have a pattern exposing a portion of the n+ doped layer 240 for connection with an external wiring. Meanwhile, a portion of one surface of the first layer 232 facing the n-type well layer 231 may be in contact with the n-type well layer 231, and another portion of the one surface of the first layer 232 may be in contact with the pinning layer 220.

Referring to FIG. 13, the photodiode 201 is different from the photodiode 200 of FIG. 12 in that an intermediate layer 234 is further provided between the n-type well layer 231 and the first layer 232. That is, the Schottky junction structure layer 291 includes the n-type well layer 231, the first layer 232, and the intermediate layer 234. The rest of the configuration of the photodiode 201 is substantially the same as the photodiode 200 of FIG. 12. The intermediate layer 234 may be substantially the same as the intermediate layer 134 described with reference to FIG. 5.

Referring to FIG. 14, the photodiode 202 is different from the photodiode 200 of FIG. 12 in that the pinning layer 222 is in contact with one surface of the first layer 232, and the entire surface facing the n-type well layer 231. In the embodiment, the pinning layer 222 may serve to fix potentials, and it may also be interpreted that a partial region of the pinning layer 222 is included in the Schottky junction structure layer 292. The rest of the configuration of the photodiode 202 is substantially the same as the photodiode 200 of FIG. 12.

Figure 15:
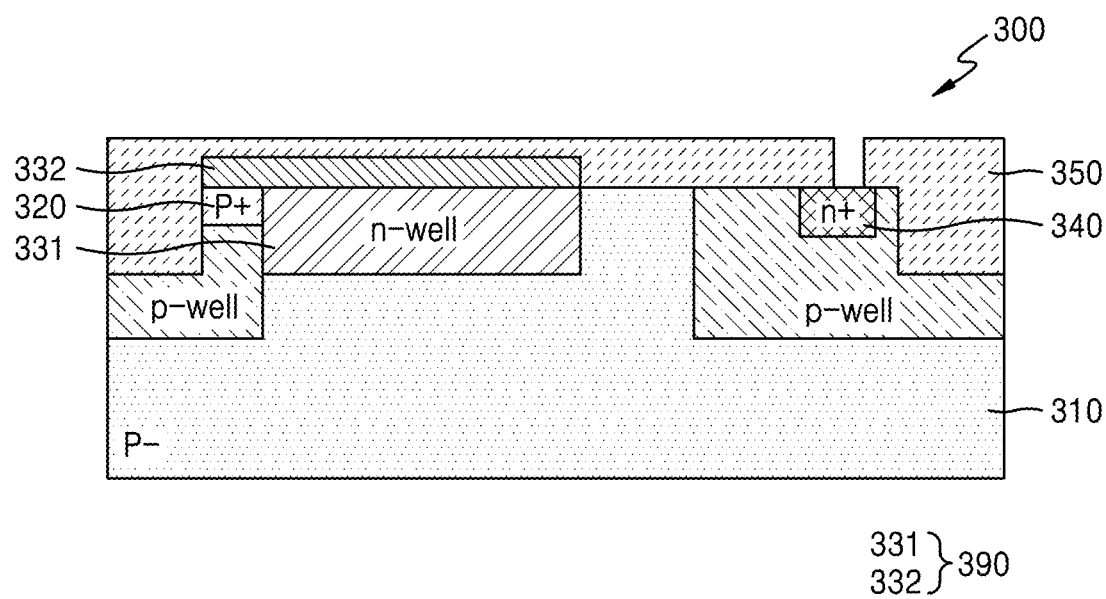
Figure 16:
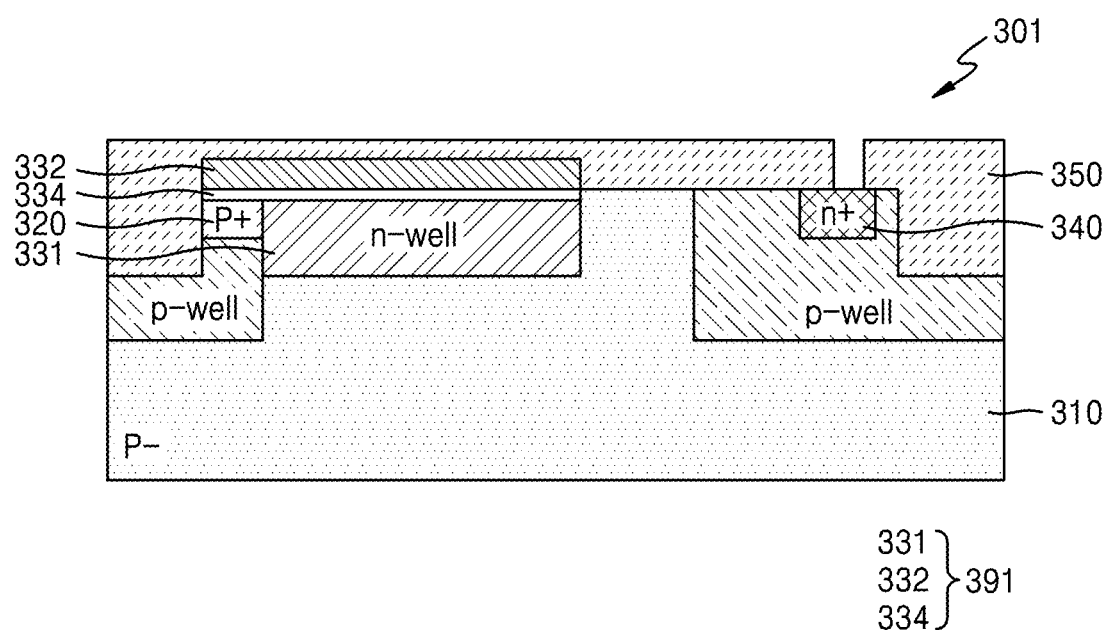
Figure 17:
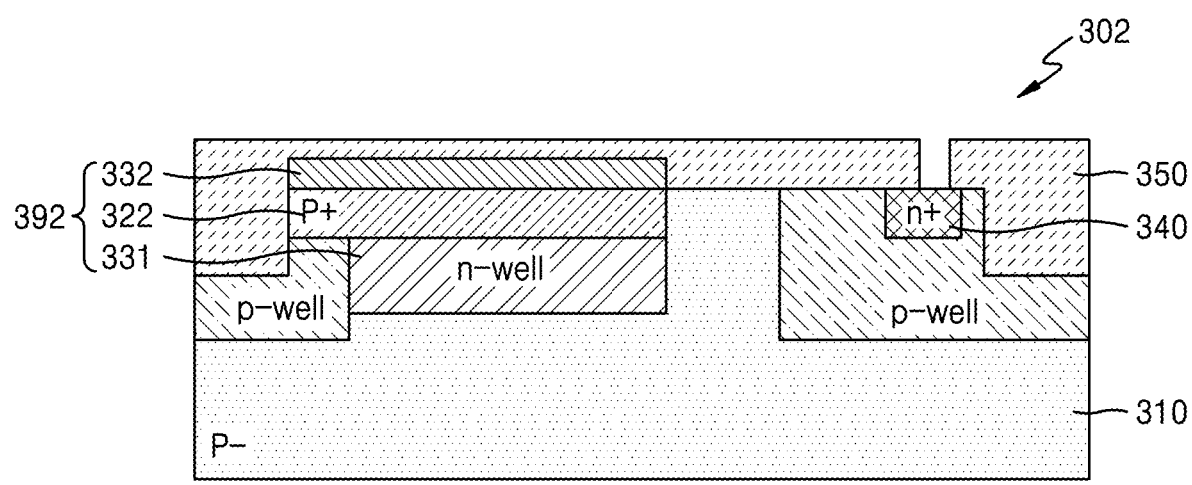

Photodiodes 300, 301, and 303 of FIGS. 15 to 17 may have, for example, a structure suitable for being applied to an image sensor having a 4-transistor (4T) circuit structure.

Referring to FIG. 15, the photodiode 300 may include a Schottky junction structure layer 390 and a pinning layer 320 formed on a p-type semiconductor substrate 310. An n-type well layer 331 may be formed in a partial region of the p-type semiconductor substrate 310, and a Schottky barrier junction structure may be formed at an interface between the n-type well layer 331 and the first layer 332. A p-type well layer (p-well) may be formed in a portion of the semiconductor substrate 310, and a portion of the p-type well layer (p-well) may be heavily doped with an n-type dopant to form an n+ doped layer 340. The semiconductor substrate 310, the pinning layer 320, and the first layer 332 may be the same as the semiconductor substrate 110, the pinning layer 120, and the first layer 132 of FIG. 1, respectively. An insulating layer 350 may be provided on an uppermost surface of the photodiode 300. The insulating layer 350 may have a pattern for exposing a portion of the n+ doped layer 340 for connection with an external wiring. Meanwhile, a portion of one surface of the first layer 332 facing the n-type well layer 331 may be in contact with the n-type well layer 331, and another portion of the one surface of the first layer 332 may be in contact with the pinning layer 320.

Referring to FIG. 16, the photodiode 301 may further include an intermediate layer 334 between the first layer 332 and the n-type well layer 331. The Schottky junction structure layer 391 is different from the Schottky junction structure layer 390 of the photodiode 300 of FIG. 15 in that the Schottky junction structure layer 391 includes an n-type well layer 331, a first layer 332, and an intermediate layer 334, and the rest of the configuration of the photodiode 301 is substantially the same as the photodiode 300. The intermediate layer 334 may be substantially the same as the intermediate layer 134 described with reference to FIG. 5.

Referring to FIG. 17, the photodiode 302 is different from the photodiode 300 of FIG. 15 in that the pinning layer 322 is in contact with one surface of the first layer 332, and the entire surface facing the n-type well layer 331. In the embodiment, the pinning layer 322 may serve to fix potentials, and it may also be interpreted that a partial region of the pinning layer 322 is included in the Schottky junction structure layer 392. The rest of the configuration of the photodiode 302 is substantially the same as the photodiode 300 of FIG. 15.

Figure 18:
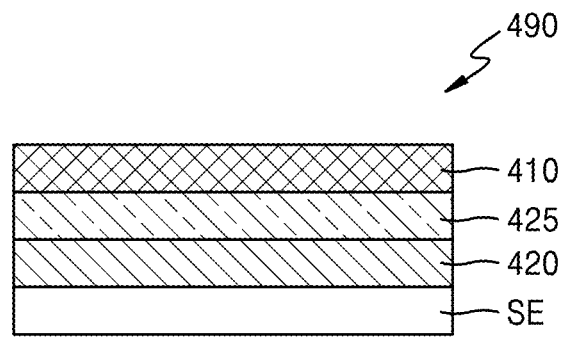
FIGS. 18 and 19 are cross-sectional views illustrating another example Schottky junction structure layer that may be applied to a photodiode according to embodiments.
Figure 19:
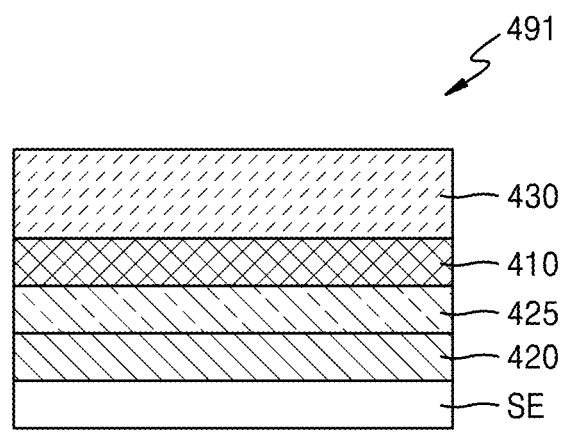

FIGS. 18 and 19 are cross-sectional views illustrating another example Schottky junction structure layers 490 and 491 that may be applied to a photodiode according to embodiments.

Referring to FIG. 18, the Schottky junction structure layer 490 may include a semiconductor layer SE and a first layer 410. The semiconductor layer SE may include an n-type well layer or a p-type well layer. The Schottky junction structure layer 490 may include a second layer 420 in contact with the semiconductor layer SE. The Schottky junction structure layer 490 may further include an intermediate layer 425 between the first layer 410 and the second layer 420.

Alternately, the Schottky junction structure layer 490 may include only the first layer 410 and the second layer 420.

The first layer 410 may include a metallic material including Au, Al, Ag, Cu, Pt, Ni, W, Ti, Mo, Ru, or Ge. The first layer 410 may include a transparent conductive oxide (TCO) having a property of being transparent to light in an infrared to visible light band. The first layer 410 may include, for example, ITO, IWO, IZO, GZO, GIZO, or AZO.

The second layer 420 may include a metallic material having a similar or lower value of work function than the work function of the first layer. The work function of the second layer 420 may be set to have a Schottky-barrier height of the Schottky junction structure similar or lower than a Schottky-barrier height of a structure in which a material of the first conductive layer and a material of the semiconductor layer are combined.

The second layer 420 may include silicide. The second layer 420 may include a silicide material, for example, TiSi, $TiSi_2$, $Ti_5Si_3$, $VSi_2$, $FeSi_2$, $CoSi_2$, PtSi, $Pt_2Si$, NiSi, $NiSi_2$, $Ni_2Si$, $Cu_3Si$, YSi, ZrSi, $NbSi_2$, $MoSi_2$, PdSi, $Pd_2Si$, ErSi, YbSi, $YbSi_2$, $ZrSi_2$, HfSi, $HfSi_2$, TaSi, $TaSi_2$, NbSi, $NbSi_2$, ZrSi, $ZrSi_2$, VSi, $VSi_2$, WSi, $WSi_2$, GeSi, OsSi, IrSi, $IrSi_3$, AlSi, CuSi, RuSi, or $Ru_2Si_3$. The second layer 420 may have a thickness greater than 0 and less than or equal to about 100 nm.

The intermediate layer 425 may include an oxide. The intermediate layer 425 may include, for example, $SiO_2$, $Al_2O_3$, $HfO_2$, or $TiO_2$. The intermediate layer 425 may include nitride. The intermediate layer 425 may include, for example, TiN, AlN, or $Si_3N_4$.

Referring to FIG. 19, the Schottky junction structure layer 491 may include a first layer 410, a second layer 420, an intermediate layer 425 between the first layer 410 and the second layer 420, and a distributed Bragg reflective layer (DBR layer) 430 on the first layer 410. The DBR layer 430 may reflect light of a specific wavelength band and transmit light of other wavelength bands. When a portion of light incident on the Schottky junction structure layer 491 and the semiconductor layer SE is absorbed and another portion of the light is transmitted, the DBR layer 450 may reflect the transmitted light to be reabsorbed in the second Schottky junction structure layer 491 and the semiconductor layer SE. The DBR layer 430 may be a multilayer reflective mirror including two materials having different refractive indices, and may generate Fresnel reflection at an interface of each material due to a difference in refractive indices. The two different materials constituting the DBR layer 430 may be, for example, $SiO_2$ and $Si_3N_4$.

In FIG. 19, although it is depicted only the structure in which the DBR layer 430 is disposed on the first layer of FIG. 18, the DBR layer 430 may also be disposed on the first layer of FIGS. 12 to 17.

The Schottky junction structural layers 490 and 491 illustrated in FIGS. 18 and 19 or combinations or modified structures therefrom may be applied to the Schottky junction structural layers of FIGS. 12 to 17.

Figure 20:
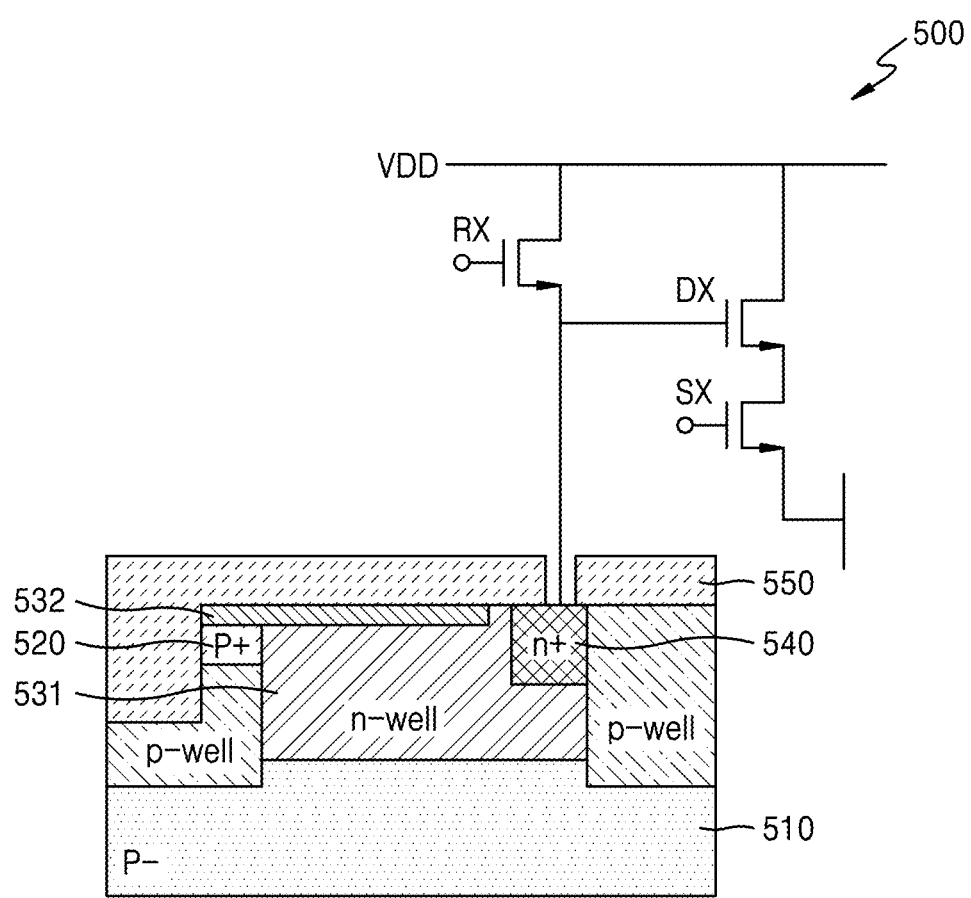
FIGS. 20 and 21 are equivalent circuit diagrams of an image sensor according to an embodiment.
Figure 21:
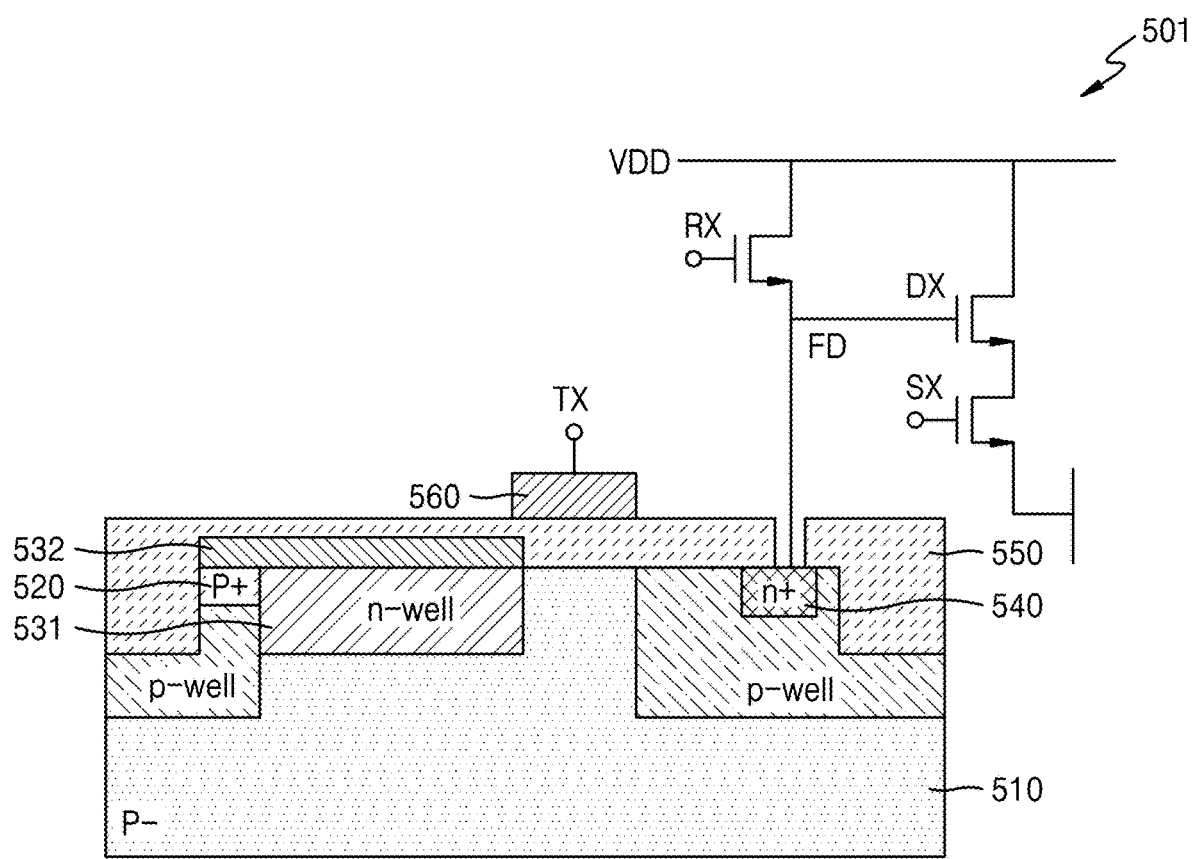

FIGS. 20 and 21 are equivalent circuit diagrams of an image sensor according to an embodiment. The image sensor includes a semiconductor substrate 510, a Schottky junction structure layer disposed on the semiconductor substrate 510 and including a first layer 532 including a conductive material and a semiconductor layer 531, a photodiode disposed adjacent to the Schottky junction structure layer and including a pinning layer 520 for fixing potentials of the semiconductor substrate 510 and the first layer 532, and at least one transistor that controls an electrical signal generated from the photodiode. The first layer 532 may include a metal or a transparent conductive oxide (TCO) material.

Referring to FIG. 20, the equivalent circuit 500 of a 3-transistor (3T) active pixel sensor may include a photodiode, a reset transistor RX, a drive transistor DX, and a selection transistor SX. The photodiode may accumulate photocharges corresponding to an amount of incident light. The photodiode may be the same as the photodiodes 200, 201, and 203 shown in FIGS. 12 to 14. A floating diffusion node located apart from the Schottky junction structure layer may further be formed on the semiconductor substrate 510. The reset transistor RX is connected between a sense node and a drain voltage VDD, and may reset a potential of the sense node in response to a reset control signal. Here, the drain voltage VDD may be a power voltage. The drive transistor DX may amplify a change in an electrical potential of the sense node that receives photocharges accumulated in the photodiodes and transfer a result of amplification to the selection transistor SX. The selection transistor SX may perform a function of selecting a pixel to be read in units of rows.

Referring to FIG. 21, the equivalent circuit 501 of a 4-transistor (4T) active pixel sensor may include a photodiode, an electrode 560, a transfer transistor TX, a reset transistor RX, a drive transistor DX, and a selection transistor (SX). The photodiode may accumulate photocharges corresponding to the amount of incident light. The photodiode may be the same as the photodiodes 300, 301, and 302 shown in FIGS. 15 to 17. One end of the photodiode may be connected to a source voltage and the other end may be connected to the transfer transistor TX. Here, the source voltage may be a ground voltage. The electrode 560 may contact a portion of an upper surface of an insulating layer 550 and may be connected to the transfer transistor TX. A floating diffusion node FD located apart from the Schottky junction structure layer may further be formed on the semiconductor substrate 510. The transfer transistor TX may be connected between the photodiode and the floating diffusion FD. The transfer transistor TX may be turned-on or turned-off in response to a transmission control signal, and the turned-on transfer transistor TX transfers photocharges accumulated in the photodiode to the floating diffusion FD. The floating diffusion FD may accumulate photocharges of the photodiode transferred through the transfer transistor TX. The floating diffusion FD may be modeled as one junction capacitor. The reset transistor RX is connected between the drain voltage VDD and the floating diffusion FD, and may reset a potential of the floating diffusion FD in response to the reset control signal. Here, the drain voltage VDD may be a power voltage. The drive transistor DX may amplify a change in an electrical potential of the floating diffusion FD that has received the photocharge accumulated in the photodiodes and transfer a result of amplification to the selection transistor SX. The selection transistor SX may perform a function of selecting a pixel to be read in units of rows. The selection transistor SX may be turned-on according to a selection control signal, and thus, a signal corresponding to the change in an electrical potential of the floating diffusion FD may be output as an output voltage, in which the electrical potential is provided to a drain (e.g., a source of a source follower transistor) of the selection transistor SX. An output voltage of the selection transistor SX may correspond to a reference signal (a signal corresponding to the floating diffusion FD in a reset state) and an image signal (a signal corresponding to the floating diffusion FD in a state in which photocharges transferred from the photodiode are accumulated).

From the above fact, according to the technical spirit of embodiments of the disclosure, it may be confirmed that the photodiode may sense light in the visible and infrared bands and show high external quantum efficiency for light in a wide wavelength band.

The photodiode of the disclosure may be used as an image sensor of a general camera for acquiring a visible light image, and also may be used as an image sensor suitable for night time and crime prevention cameras by using an infrared ray (a near infrared ray (NIR) and a short wavelength infrared ray (SWIR)). In addition, the photodiode may be used as an image sensor suitable for thermal imaging cameras and military cameras that use an infrared ray (a mid wavelength infrared ray (MWIR) and a long wavelength infrared ray (LWIR)).

According to an embodiment, the photodiode may sense light of a wide wavelength band including a visible light band and an infrared light band.

According to the embodiment, the photodiode has a simpler CMOS process than a P-N junction technology, thereby reducing mass production costs.

According to the embodiment, the photodiode may be utilized in an image sensor applicable to various wavelength bands.

The photodiode and the image sensor including the same have been described with reference to the embodiment shown in the drawings, but it will be understood by those skilled in the art that this is only an example and various modifications and equivalent other embodiments are possible. Therefore, the embodiments should be considered in descriptive sense only and not for purposes of limitation. The scope of embodiments falling within this disclosure is defined not by the detailed description herein but by the appended claims and their equivalents.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A photodiode comprising:
a semiconductor substrate;
a Schottky junction structure layer arranged on the semiconductor substrate, the Schottky junction structure layer including a first layer including a conductive material and a semiconductor layer; and
a pinning layer disposed adjacent to the Schottky junction structure layer, the pinning layer fixing potentials of the semiconductor substrate and the first layer.

2. The photodiode of claim 1, wherein the semiconductor layer is n-type, and
a work function of the first layer satisfies the following condition:

$$\varphi_M > \chi_s$$

where $\varphi_M$ is a work function of the first layer, and $\chi_s$ is electron affinity of the semiconductor layer.

3. The photodiode of claim 1, wherein the semiconductor layer is p-type, and
a work function of the first layer satisfies the following condition:

$$\varphi_M < \chi_s + E_g$$

where $\varphi_M$ is a work function of the first layer, $\chi_s$ is electron affinity of the semiconductor layer, and $E_g$ is bandgap energy of the semiconductor layer.

4. The photodiode of claim 1, wherein the first layer includes a metal or a transparent conductive oxide (TCO) material.

5. The photodiode of claim 4, wherein the metal of the first layer includes at least one or a combination of Au, Al, Ag, Cu, Pt, Ni, W, Ti, Mo, Ru, Ge, Ta, Hf, Nb, Zr, and V.

6. The photodiode of claim 4, wherein the TCO material of the first layer includes at least one oxide semiconductor material, such as ITO, IWO, IZO, GZO, GIZO, and AZO.

7. The photodiode of claim 4, wherein the first layer has a thickness greater than 0 nm and less than or equal to about 100 nm.

8. The photodiode of claim 1, wherein the Schottky junction structure layer further includes a second layer including silicide in contact with the semiconductor layer.

9. The photodiode of claim 8, wherein a work function of the second layer is set to have a Schottky barrier height of the Schottky junction structure layer lower than a Schottky barrier height of a structure in which a material of the first layer and a material of the semiconductor layer are combined.

10. The photodiode of claim 8, wherein the second layer includes at least one silicide material, such as TiSi, $TiSi_2$, $Ti_5Si_3$, $VSi_2$, $FeSi_2$, $CoSi_2$, PtSi, $Pt_2Si$, NiSi, $NiSi_2$, $Ni_2Si$, $Cu_3Si$, YSi, ZrSi, $NbSi_2$, $MoSi_2$, PdSi, $Pd_2Si$, ErSi, YbSi, $YbSi_2$, $ZrSi_2$, HfSi, $HfSi_2$, TaSi, $TaSi_2$, NbSi, $NbSi_2$, ZrSi, $ZrSi_2$, VSi, $VSi_2$, WSi, $WSi_2$, GeSi, OsSi, IrSi, $IrSi_s$, AlSi, CuSi, RuSi, and $Ru_2Si_3$ or a combination thereof.

11. The photodiode of claim 8, wherein the second layer includes a metallic material having a work function less than that of the first layer.

12. The photodiode of claim 8, wherein the Schottky junction structure layer further includes an intermediate layer including an oxide or a nitride and disposed between the first layer and the second layer.

13. The photodiode of claim 12, wherein the intermediate layer includes an oxide, such as at least one of $SiO_2$, $Al_2O_3$, $HfO_2$, and $TiO_2$, or a nitride, such as at least one of TiN, AlN, and $Si_3N_4$.

14. The photodiode of claim 1, wherein a portion of one surface of the first layer facing the semiconductor layer is in contact with the semiconductor layer, and
another portion of the one surface of the first layer is in contact with the pinning layer.

15. The photodiode of claim 1, wherein the one surface of the first layer facing the semiconductor layer is entirely in contact with the pinning layer.

16. The photodiode of claim 1, wherein the Schottky junction structure layer further includes a distributed Bragg reflective layer (DBR layer) on the first layer.

17. The photodiode of claim 1, wherein the photodiode is configured to sense light in visible and infrared bands.

18. An image sensor comprising:
a photodiode comprising a semiconductor substrate, a Schottky junction structure layer arranged on the semiconductor substrate, the Schottky junction structure layer including a first layer including a conductive material and a semiconductor layer, and a pinning layer disposed adjacent to the Schottky junction structure layer, the pinning layer fixing potentials of the semiconductor substrate and the first layer; and
at least one transistor for controlling an electrical signal generated by the photodiode.

19. The image sensor of claim 18, wherein a sense node apart from the Schottky junction structure layer is further formed on the semiconductor substrate,
wherein the at least one transistor includes:
a reset transistor for resetting a potential of the sense node;
a drive transistor for amplifying a change in an electrical potential of the sense node and transferring a result of amplification to a selection transistor; and
a selection transistor that selects unit pixels to be read in units of rows.

20. The image sensor of claim 18, wherein a floating diffusion node is located apart from the Schottky junction structure layer,
wherein the at least one transistor includes:
a transfer transistor connected between the photodiode and the floating diffusion node;
a reset transistor for resetting a potential of the floating diffusion node;
a drive transistor for amplifying a change in an electrical potential of the floating diffusion node and transferring a result of amplification to a selection transistor; and
a selection transistor for selecting unit pixels to be read in units of rows.

* * * * *